(12) United States Patent
Ruhl et al.

(10) Patent No.: US 10,134,848 B2
(45) Date of Patent: Nov. 20, 2018

(54) SEMICONDUCTOR DEVICE HAVING A GRAPHENE LAYER, AND METHOD OF MANUFACTURING THEREOF

(71) Applicant: Infineon Technologies AG, Neubiberg (DE)

(72) Inventors: Guenther Ruhl, Regensburg (DE); Hans-Joachim Schulze, Taufkirchen (DE); Thomas Zimmer, Talence (FR); Gunther Lippert, Frankfurt (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/464,405

(22) Filed: Mar. 21, 2017

(65) Prior Publication Data

US 2017/0278930 A1 Sep. 28, 2017

(30) Foreign Application Priority Data

Mar. 24, 2016 (DE) ........................ 10 2016 105 610

(51) Int. Cl.
| | |
|---|---|
| *H01L 21/20* | (2006.01) |
| *H01L 29/16* | (2006.01) |
| *H01L 21/762* | (2006.01) |
| *H01L 21/02* | (2006.01) |
| *H01L 21/18* | (2006.01) |

(Continued)

(52) U.S. Cl.
CPC .... *H01L 29/1606* (2013.01); *H01L 21/02447* (2013.01); *H01L 21/02494* (2013.01); *H01L 21/02527* (2013.01); *H01L 21/02529* (2013.01); *H01L 21/02587* (2013.01); *H01L 21/02609* (2013.01); *H01L 21/02612* (2013.01); *H01L 21/02658* (2013.01); *H01L 21/187* (2013.01); *H01L 21/2007* (2013.01); *H01L 21/26506* (2013.01); *H01L 21/324* (2013.01); *H01L 21/568* (2013.01); *H01L 21/6835* (2013.01); *H01L 21/76251* (2013.01); *H01L 21/76254* (2013.01); *H01L 21/78* (2013.01); *H01L 29/04* (2013.01); *H01L 29/0657* (2013.01); *H01L 29/165* (2013.01); *H01L 29/1608* (2013.01); *H01L 2221/6835* (2013.01); *H01L 2221/68377* (2013.01); *H01L 2221/68381* (2013.01)

(58) Field of Classification Search
CPC ........................... H01L 21/2003; H01L 21/71
See application file for complete search history.

(56) References Cited

U.S. PATENT DOCUMENTS

| | | |
|---|---|---|
| 2014/0225125 A1 | 8/2014 | Berger et al. |
| 2014/0335676 A1 | 11/2014 | Rupp et al. |

(Continued)

FOREIGN PATENT DOCUMENTS

| | | |
|---|---|---|
| DE | 102011054035 A1 | 4/2012 |
| DE | 102014118336 A1 | 6/2015 |
| EP | 2736067 A1 | 5/2014 |

*Primary Examiner* — Cheung Lee
(74) *Attorney, Agent, or Firm* — Murphy, Bilak & Homiller, PLLC

(57) ABSTRACT

A method for manufacturing a semiconductor device includes: providing a carrier wafer and a silicon carbide wafer; bonding a first side of the silicon carbide wafer to the carrier wafer; splitting the silicon carbide wafer bonded to the carrier wafer into a silicon carbide layer thinner than the silicon carbide wafer and a residual silicon carbide wafer, the silicon carbide layer remaining bonded to the carrier wafer during the splitting; and forming a graphene material on the silicon carbide layer.

21 Claims, 11 Drawing Sheets

(51) Int. Cl.
  *H01L 21/265* (2006.01)
  *H01L 21/324* (2006.01)
  *H01L 21/56* (2006.01)
  *H01L 21/78* (2006.01)
  *H01L 29/04* (2006.01)
  *H01L 29/165* (2006.01)
  *H01L 21/683* (2006.01)
  *H01L 29/06* (2006.01)

(56) References Cited

U.S. PATENT DOCUMENTS

| | | |
|---|---|---|
| 2015/0171045 A1 | 6/2015 | Berger et al. |
| 2015/0262862 A1 | 9/2015 | Kubota et al. |

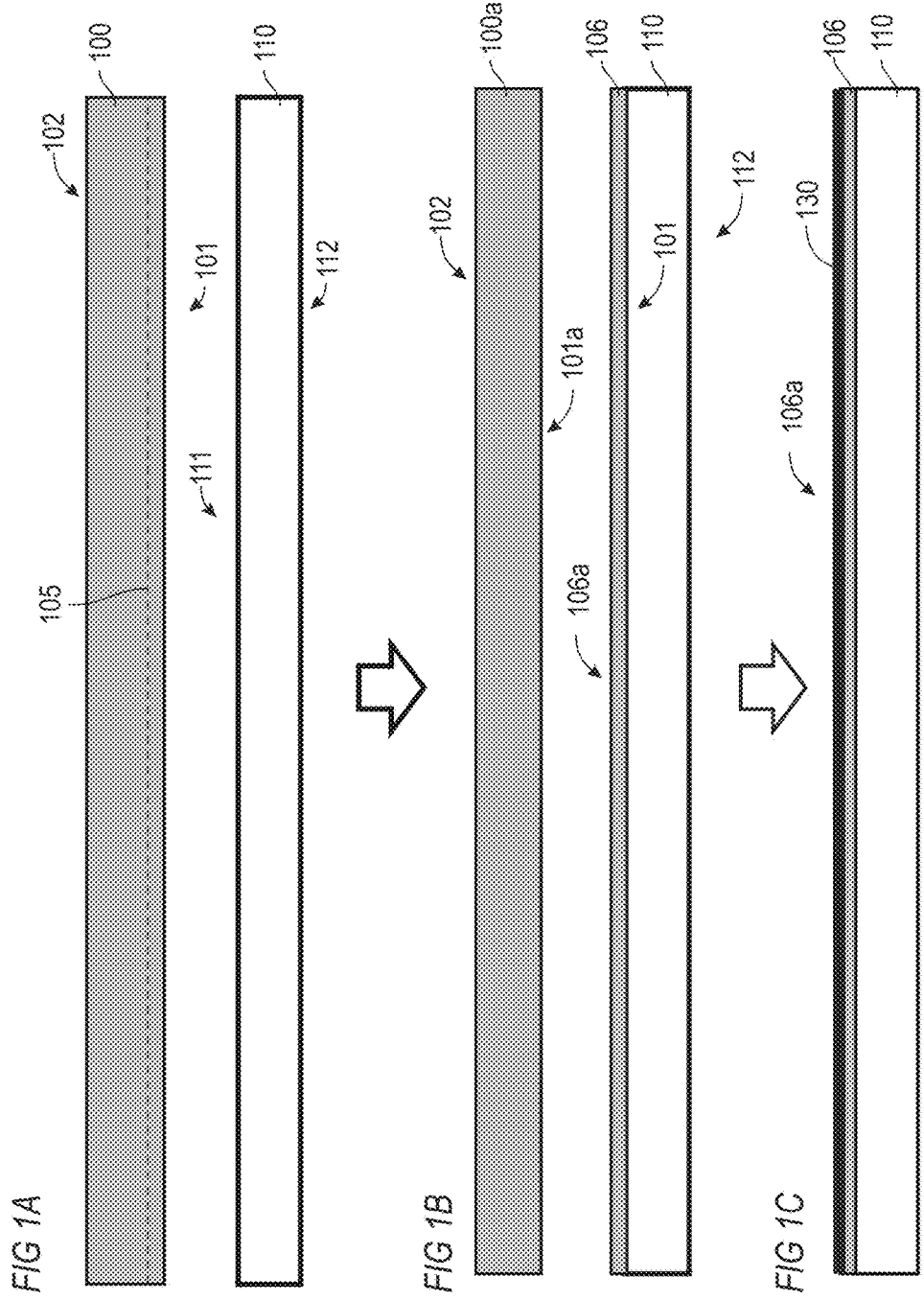

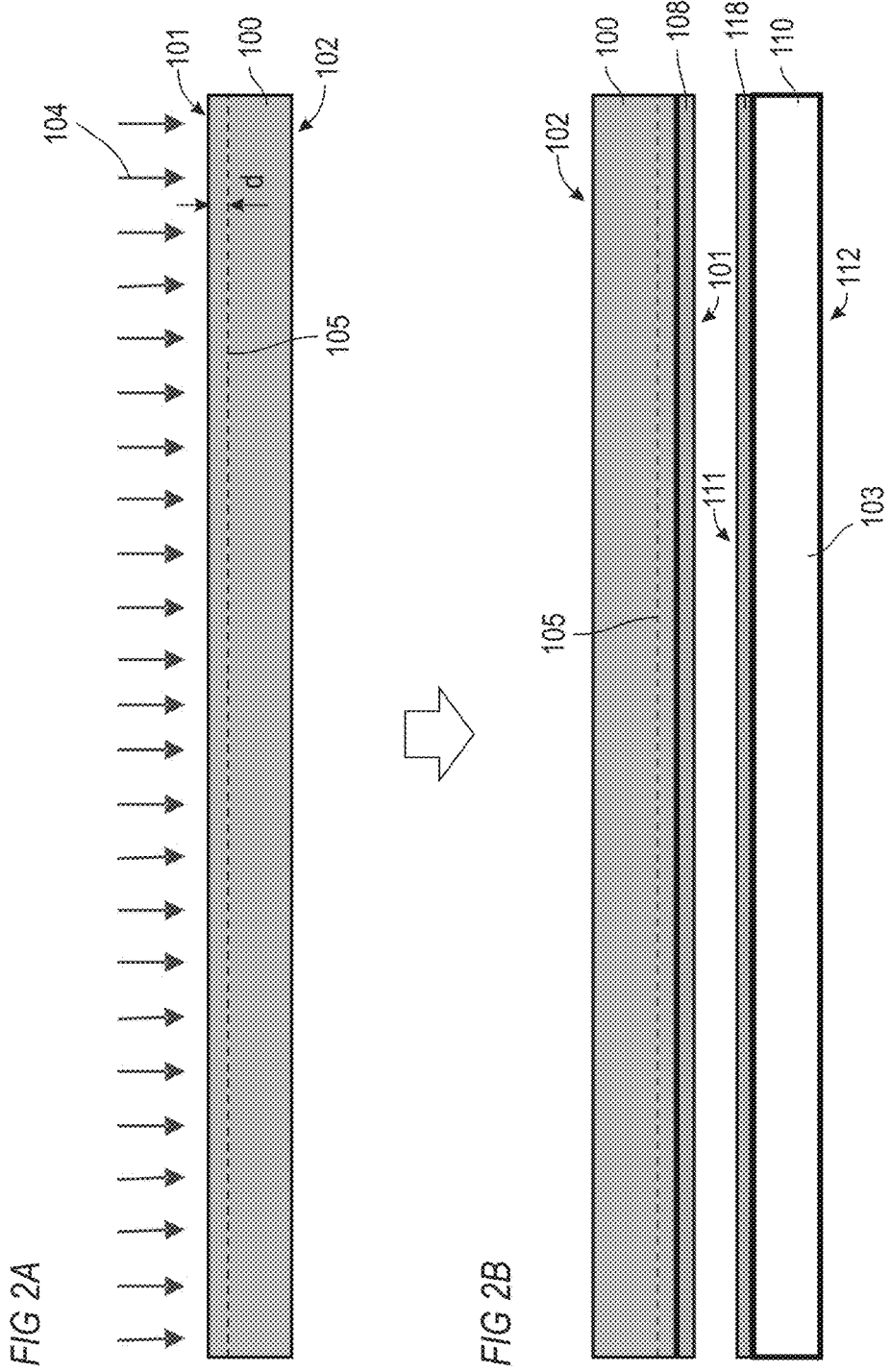

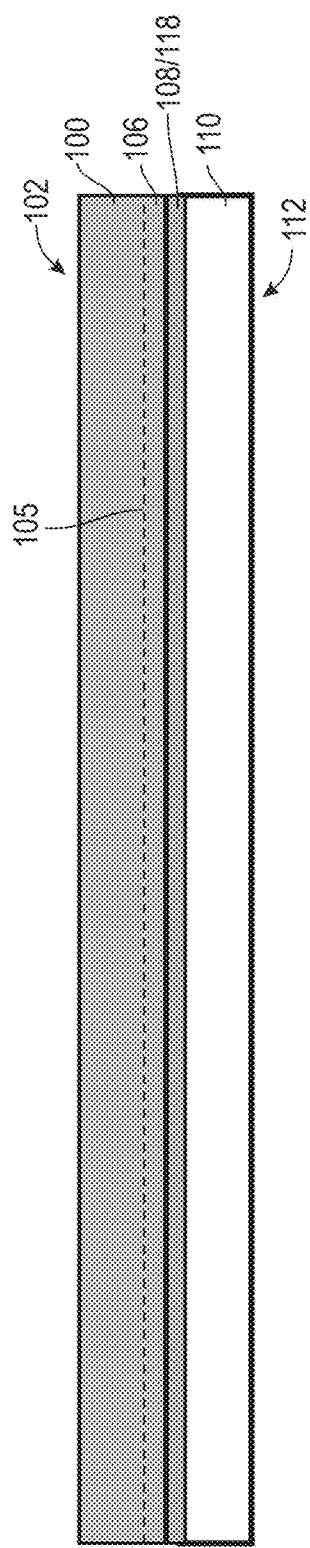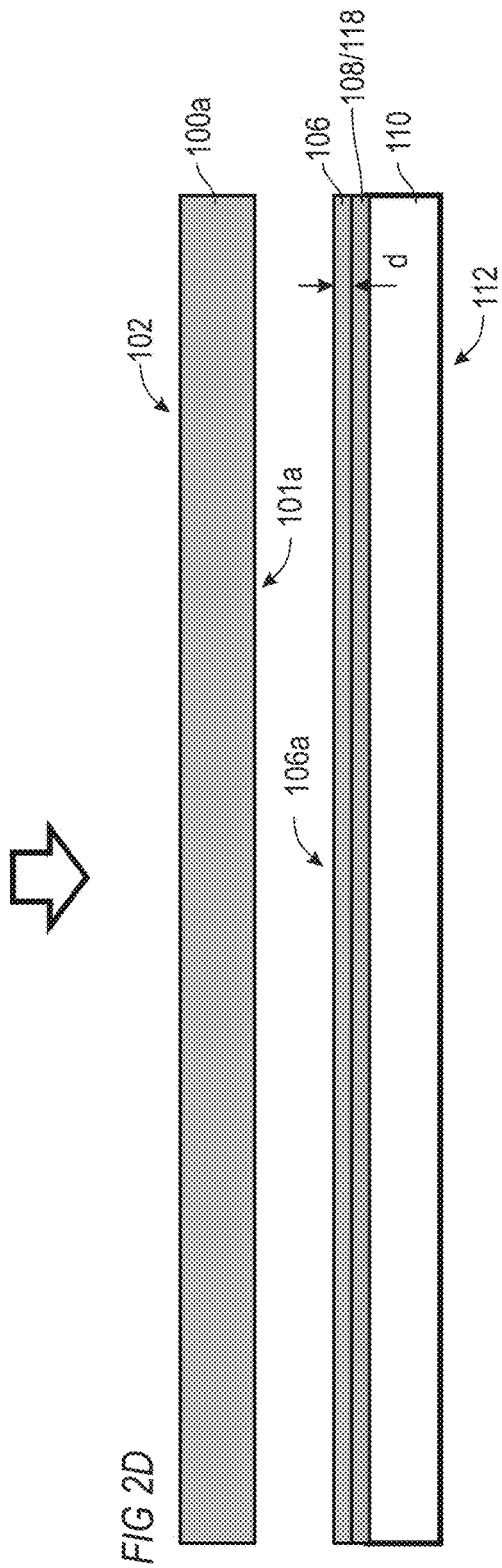

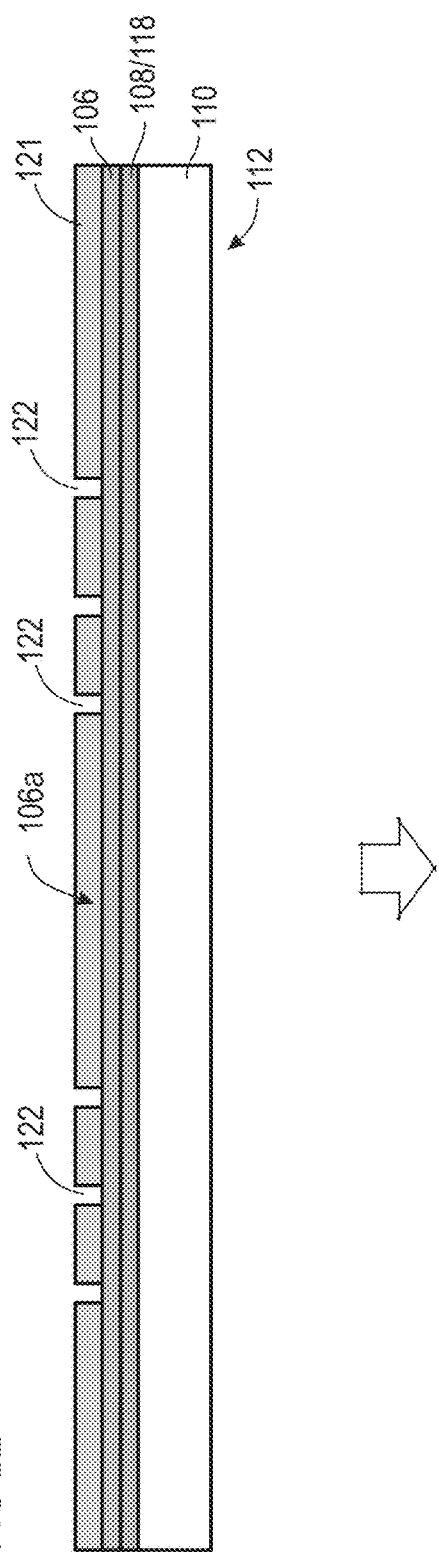

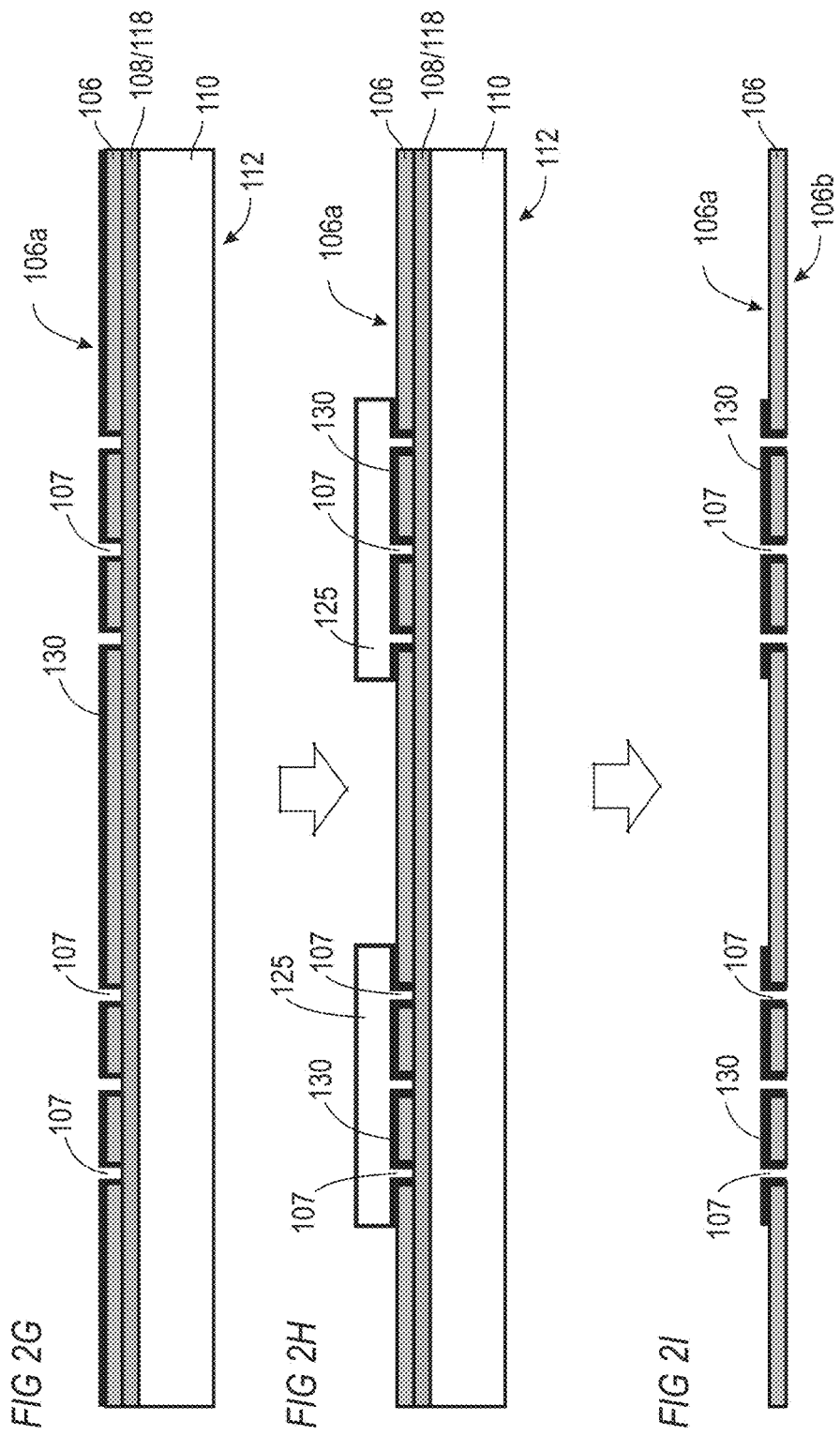

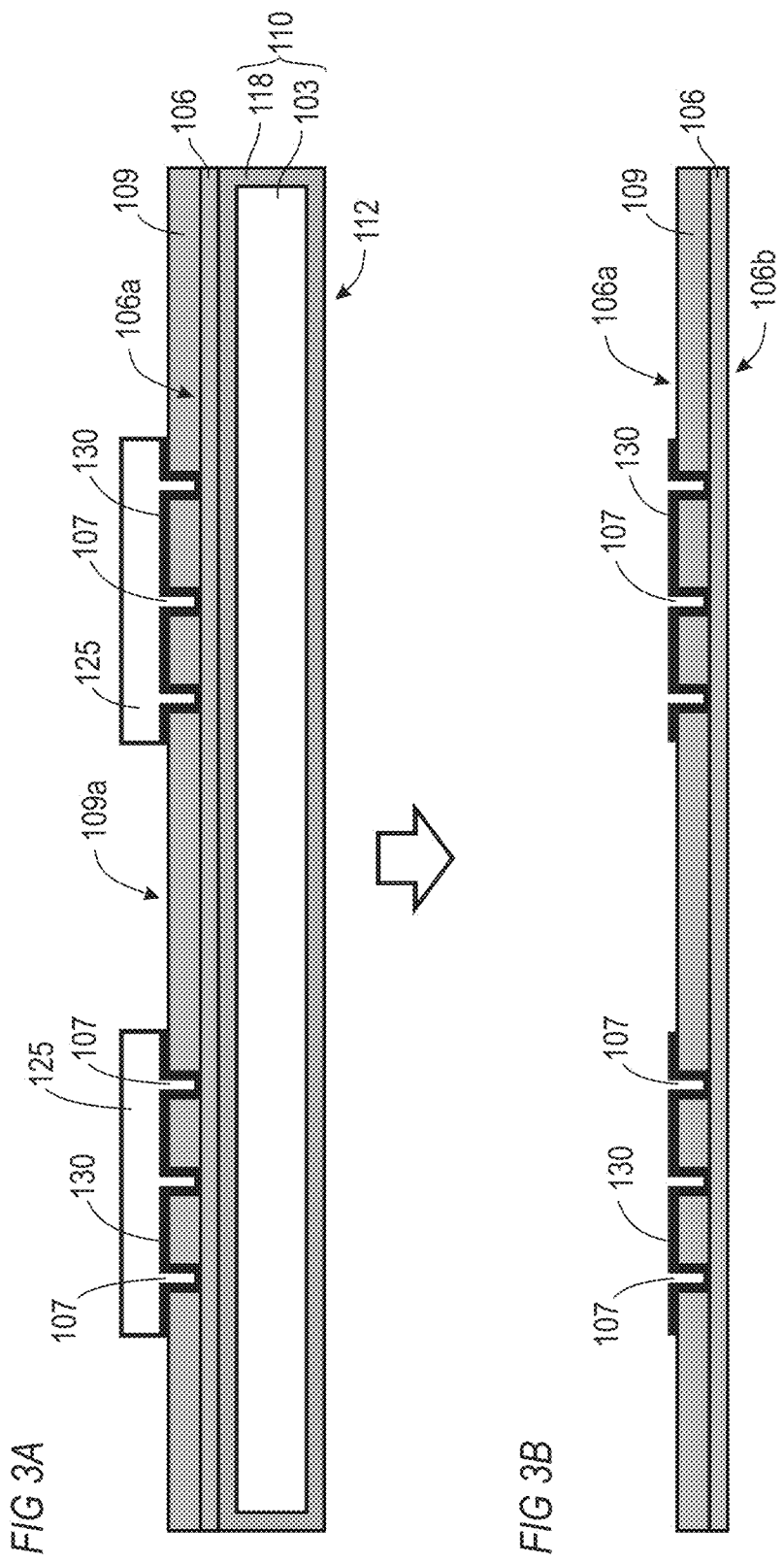

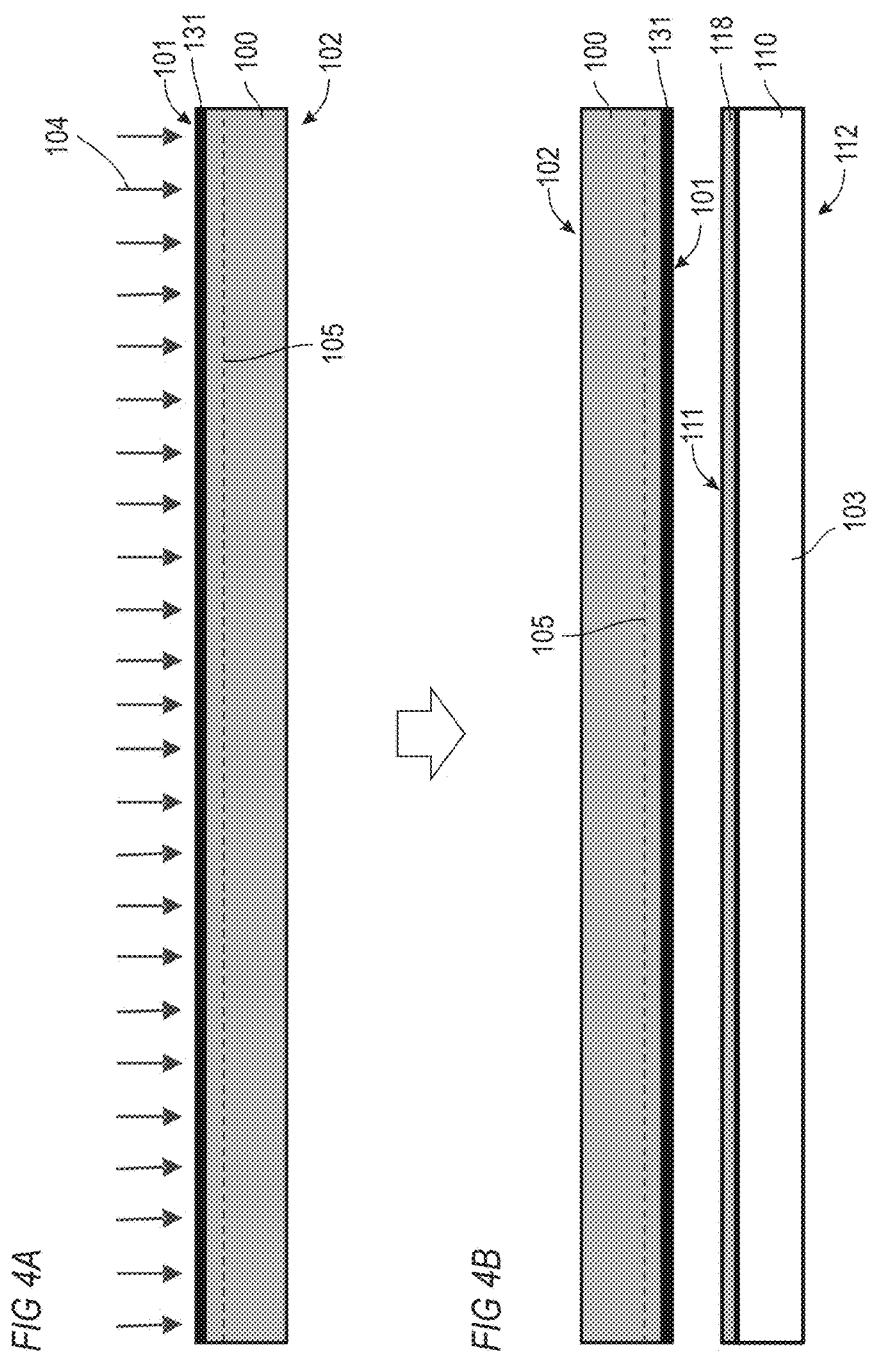

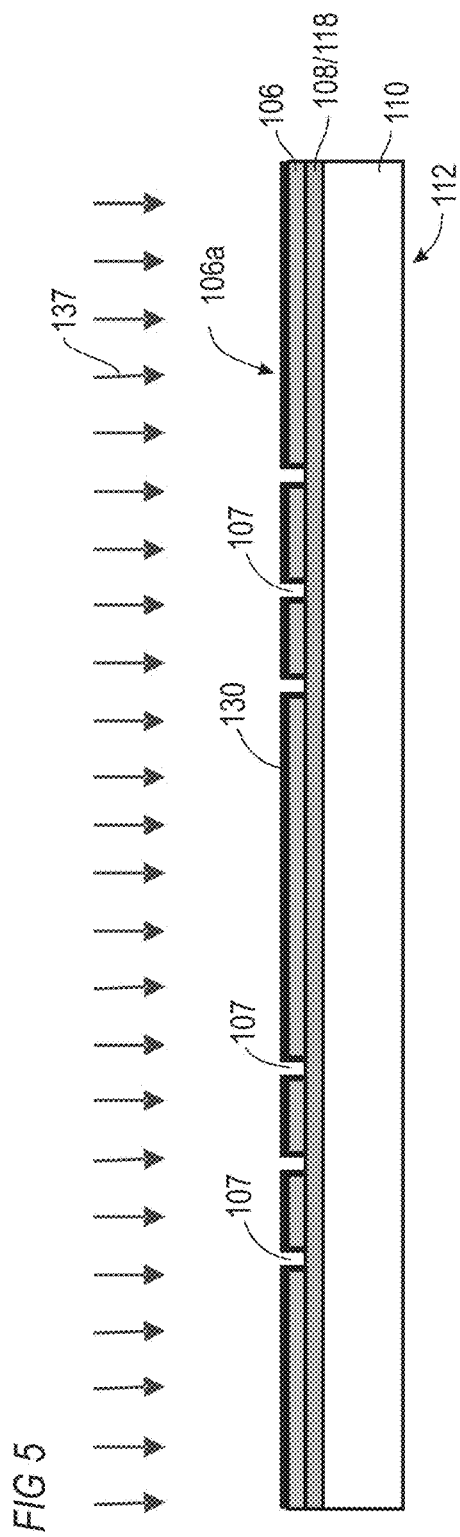

SEMICONDUCTOR DEVICE HAVING A GRAPHENE LAYER, AND METHOD OF MANUFACTURING THEREOF

TECHNICAL FIELD

Embodiments described herein relate to methods for manufacturing semiconductor devices having a graphene material such as one or more graphene layers. Further embodiments pertain to semiconductor devices, such as unipolar and bipolar power devices having at least one graphene layer for forming a channel region of the respective power device.

BACKGROUND

Silicon carbide (SiC) is a widely used semiconductor material for power semiconductor devices due to its high blocking voltage and its capability to operate reliably at high temperatures. An important parameter that influences the overall device performance is the so-called on-resistance $R_{on}$, which is mainly governed by the resistance of the drift region and of the channel region. In order to reduce the resistance of the channel region attempts have been made to include a graphene layer as part of the channel region. While the formation of a graphene layer on plane surfaces of semiconductor materials has attracted much attention, the formation of graphene on structured surfaces is technologically still difficult.

Furthermore, semiconductor devices with a vertical current flow can include trenches with side walls along which the channel regions are formed. Depending on the rated blocking voltage of the semiconductor device the vertical thickness of the semiconductor material must be adapted. In a typical application, the final vertical thickness of the semiconductor material is significantly less than 1 mm. During manufacturing, the handling of semiconductor wafers having such a low thickness is demanding as the semiconductor material is brittle and can easily break.

For those applications, typically a carrier wafer is attached to the semiconductor wafer prior to reducing the thickness of the semiconductor wafer down to the desired vertical thickness. Mechanical processes such as grinding or polishing are currently commonly used to reduce the thickness of the semiconductor wafers. These processes, however, waste much semiconductor material which leads to an increase of manufacturing costs. Furthermore, the carrier materials which are typically used, and the bond connections between the carrier material and the semiconductor wafer, do not withstand high temperatures which may be needed to form graphene layers.

In view of the above there is need for improvement.

SUMMARY

According to one or more embodiments, a method for manufacturing a semiconductor device, includes: providing a carrier wafer and a silicon carbide wafer; bonding a first side of the silicon carbide wafer to the carrier wafer splitting the silicon carbide wafer bonded to the carrier wafer into a silicon carbide layer thinner than the silicon carbide wafer and a residual silicon carbide wafer, the silicon carbide layer remaining bonded to the carrier wafer during splitting; and forming a graphene material on the silicon carbide layer.

According to one or more embodiments, a method for manufacturing a semiconductor device, includes: a providing a carrier wafer and a silicon carbide wafer; forming a first graphene material on a first side of the silicon carbide wafer; bonding the first side of the silicon carbide wafer with the first graphene material to the carrier wafer; and splitting the silicon carbide wafer bonded to the carrier wafer into a silicon carbide layer thinner than the silicon carbide wafer and a residual silicon carbide wafer, the silicon carbide layer remaining bonded to the carrier wafer during splitting.

According to one or more embodiments, a method for manufacturing a semiconductor device, includes: providing a carrier wafer and a silicon carbide wafer; implanting gas ions into a first side of the silicon carbide wafer to form a delamination region at a predefined depth in the silicon carbide wafer, bonding the first side of the silicon carbide wafer to the carrier wafer; subjecting the silicon carbide wafer, after bonding, to a thermal anneal to split the silicon carbide wafer along the delamination region, the splitting results in the formation of a silicon carbide layer remaining bonded to the carrier wafer and a residual silicon carbide wafer, the silicon carbide layer having an exposed side; forming at least one trench in the silicon carbide layer, the trench comprising sidewalls; and forming a graphene material on at least one of the sidewalls of the trench and the exposed side of the silicon carbide layer.

According to one or more embodiments, a semiconductor device, includes a silicon carbide layer having a first side and a second side; a graphene material on at least one of the first side and a second side of the silicon carbide layer; a carrier substrate comprising a first side and a second side, the carrier substrate bonded to the second side of the silicon carbide layer, wherein the carrier substrate further comprises a graphite.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIGS. 1A to 1C illustrate processes of a method for manufacturing a semiconductor device according to an embodiment.

FIGS. 2A to 2I illustrate processes of a method for manufacturing a semiconductor device according to an embodiment.

FIGS. 3A to 3B illustrate processes of a method for manufacturing a semiconductor device according to an embodiment.

FIGS. 4A to 4B illustrate processes of a method for manufacturing a semiconductor device according to an embodiment.

FIG. 5 illustrate processes of a method for manufacturing a semiconductor device according to an embodiment.

DETAILED DESCRIPTION

Figure 6:
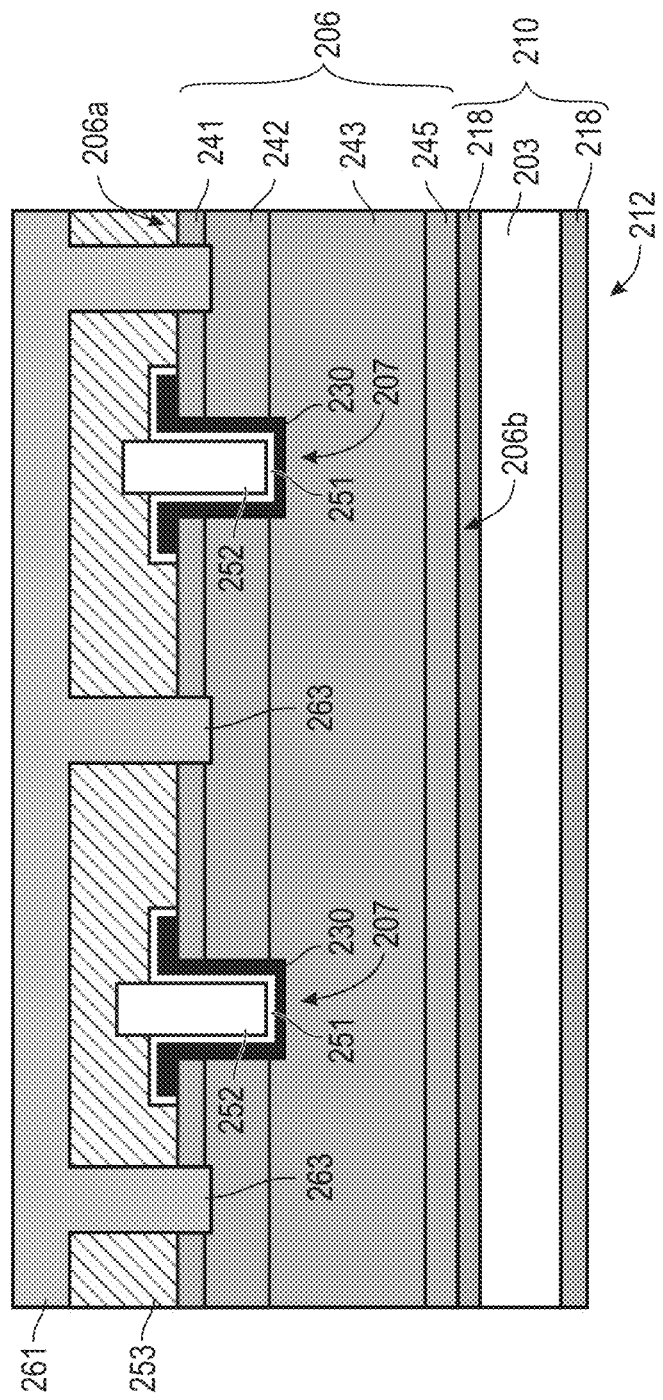
FIG. 6 illustrates a semiconductor device according to an embodiment.

In the following Detailed Description, reference is made to the accompanying drawings, which form a part hereof, and in which are shown by way of illustration specific embodiments in which the invention may be practiced. In this regard, directional terminology, such as "top", "bottom", "front", "back", leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

It is to be understood that features of the various exemplary embodiments described herein may be combined with each other, unless specifically noted otherwise. For example, features illustrated or described as part of one embodiment can be used in conjunction with features of other embodiments to yield yet a further embodiment. It is intended that the present description includes such modifications and variations.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

When referring to semiconductor devices, at least two-terminal devices are meant, an example is a diode. Semiconductor devices can also be three-terminal devices such as a field-effect transistors (FET), insulated gate bipolar transistors (IGBT), junction field effect transistors (JFET), and thyristors to name a few. The semiconductor devices can also include more than three terminals. According to an embodiment, semiconductor devices are power devices. Integrated circuits include a plurality of integrated devices.

Specific embodiments described herein pertain to, without being limited thereto, composite wafers having a graphite core and particularly to composite wafers having a graphite core comprised of turbostratic or amorphous or isostatically pressed crystalline graphite.

The semiconductor material can be made of any semiconductor material suitable for manufacturing semiconductor devices. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above-mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used. The present embodiments are described with reference to SiC.

With reference to FIGS. 1A to 1C, a first embodiment of a method for manufacturing semiconductor devices is described. As shown in FIG. 1A, a silicon carbide wafer 100 having a first side 101 and a second side 102, and a carrier wafer 110 having a first side 111 and a second side 112, are provided. The silicon carbide wafer 100 is used as a donor wafer for providing a thin silicon carbide layer that is to be delaminated from the silicon carbide wafer 100. The delamination region along which the silicon carbide wafer 100 is subsequently split is indicated by the dashed line 105 in FIG. 1A.

The silicon carbide wafer 100 is bonded with its first side 101 to the first side 111 of the carrier wafer 110. An optional bonding layer, which is not shown in the FIGS. 1A to 1C, can be formed on either of the first surfaces 101, 111 of the silicon carbide wafer 100 and the carrier wafer 110, respectively, or on both first surfaces 101, 111.

The thus obtained composite wafer formed by bonding the silicon carbide wafer 100 to the carrier wafer 110 is subsequently subjected to a thermal anneal to split the silicon carbide wafer 100 along the delamination region 105. The splitting results in the formation of a silicon carbide layer 106 which remains bonded to the first side 111 of the carrier wafer 110, and to a residual silicon carbide wafer 100a which is detached from the silicon carbide layer 106 as shown in FIG. 1B. The splitting of the silicon carbide wafer 100 along the delamination region 105 also results in the formation of a new first side 101a of the residual silicon carbide wafer 100a and an exposed surface or side 106a of the silicon carbide layer 106.

The residual silicon carbide wafer 100a can be reused as a donor wafer for delaminating a further silicon carbide layer that is bonded to another carrier wafer. Prior to reuse, the new first side 101a is polished for obtaining a flat and smooth surface that allows bonding to a further carrier wafer. The exposed side 106a of the silicon carbide layer 106 can also be optionally polished after splitting.

In a further process, as for example shown in FIG. 1C, a graphene material 130 is formed on the exposed side 106a of the silicon carbide layer 106. The graphene material 130 can be formed, for example, by surficial graphitization of the silicon carbide layer 106 by thermal decomposition at high temperatures, typically above 1100° C., or even above 1200° C. A typical temperature range is between 1200° C. and 1600° C. Due to its higher vapour pressure, the silicon is evaporating from the silicon carbide layer 106 and leaves a thin layer of graphene material on top of the silicon carbide layer 106. The thickness of the graphene material, i.e. the number of individual graphene layers, can be tailored by adapting the temperature and duration of the thermal decomposition process and choice of the exposed SiC crystal wafer side (C- or Si-terminated surface or side).

Since the surficial graphitization is carried out at high temperatures, the carrier wafer 110 and also the bond between the carrier wafer 110 and the silicon carbide layer 106 should withstand these temperatures. The carrier wafer 110 therefore includes, according to an embodiment, a high-temperature durable material. A promising material for the carrier wafer 110, which is capable of withstanding temperatures well above 1200° C., is for example graphite. According to an embodiment, the carrier wafer 110 therefore includes graphite which can be easily bonded to the silicon carbide wafer 100. Other possible materials include sapphire or silicon. Optionally, the temperature of the surficial graphitization may be adapted in view of the material used for the carrier wafer 110.

The processes described herein allow a cost efficient use of the silicon carbide wafer 100 which can be subjected several times to a delamination process to form separate silicon carbide layers 106 each attached to another carrier wafer 110. The waste of expensive silicon carbide material, as it is involved with the back-polishing of the silicon carbide wafers by mechanical means such as grinding or polishing, can be avoided.

Furthermore, the high-temperature durable material of the carrier wafer 110, such as graphite or carbon, can also support the thin silicon carbide layer 106 during processing of the semiconductor devices which also often includes high temperature processes such as thermal oxidation.

In addition to its capability to withstand the high temperatures during graphitization of the silicon carbide layer 106, graphite, or generally carbon, has a coefficient of thermal expansion (CTE) which is similar to, or which can be easily adapted to, the CTE of silicon carbide so that mechanical stress caused by the various thermal treatments can be minimized. Optionally, a buffer or bonding layer can be provided between the carrier wafer 110 and the silicon carbide wafer 100 for further relieving any mechanical tension between the silicon carbide wafer 100, or the remaining silicon carbide layer 106, and the carrier wafer 100.

With reference to FIGS. 2A to 2I, a more detailed description is given for an embodiment of a method for manufacturing a semiconductor device.

Briefly, a monocrystalline semiconductor wafer 100 made of silicon carbide having a first side or first surface 101 and a second side or second surface 102 arranged opposite to the first side 101 is provided.

In a further process as illustrated in FIG. 2A, gas ions 104 such as protons are implanted into the first side 101 of silicon carbide wafer 100 into a predefined depth. The implantation depth can be adjusted by selecting the implantation energy. The implantation depth defines a thickness d of the silicon carbide layer 106 as described further below.

The implantation of gas atoms or gas ions (e. g. protons), respectively, causes the formation of the delamination region 105 which can be a continuous micro-bubble layer or micro-porous layer along which the silicon carbide wafer 100 is delaminated by a later process.

According to an embodiment, the implantation energy for implanting the gas ions, particularly when using protons, can be 150 keV or less. At this not very high implantation energy, the generation of strong X-ray radiation is comparably low which is beneficial for the used equipment. When restricting the implantation energy to about 150 keV or less, no additional safety equipment is needed. Furthermore, restricting the implantation energy also reduces the energy impact into the semiconductor material and thus allows an increase of the implantation dose, i.e. beam current, to reduce the implantation duration. It is, however, also possible to use higher implantation energies if desired. By appropriately selecting the implantation energy, the location of the delamination region 105 and hence the target thickness of the silicon carbide layer 106 can be adjusted.

According to an embodiment, the implantation depth with respect to the first side 101 of the silicon carbide wafer 100 approximately corresponds to the final thickness of the silicon carbide layer 106 plus a process margin which takes account of a thickness reduction of the silicon carbide layer 106 by an optional polishing process after delamination. The desired thickness d depends on the rated blocking voltage of the final semiconductor device as a higher rated blocking voltage requires a thicker drift region and thus a thicker silicon carbide layer 106. An exemplary range for the thickness d is between 350 to 500 µm.

If the delaminated silicon carbide layer 106 is used as a seed layer for forming an epitaxial layer made of silicon carbide on the silicon carbide layer 106, a much smaller thickness d is sufficient. For example, the thickness d of the silicon carbide layer 106 can be in a range from about 10 nm to about 500 nm. Hence the thickness of the delamination layer and thus of the silicon carbide layer 106 can be much smaller than the final thickness of a device layer formed by the silicon carbide layer 106 and the subsequently formed epitaxial layer. This even further reduces the material consumption from the silicon carbide wafer 100 and thus the manufacturing costs.

In further processes, as for example shown in FIG. 2B, an optional bonding layer 108, 118 can be formed either on the first side 101 of the silicon carbide wafer 100 or on the first side 111 of the carrier wafer 110. It would also be possible to form respective bonding layers on the first side 111 of the carrier wafer 110 and also on the first side 101 of the silicon carbide wafer 100. Each bonding layer 108, 118 can be, for example about 50 nm to about 500 nm thick. The bonding layer 108 can be formed prior to or after the formation of the delamination region 105.

The bonding layer 108 formed on the first side 101 of the silicon carbide wafer 100 and the bonding layer 118 formed on the first side 111 of the carrier wafer 110 can be of the same or of different material. For example, the bonding layer 118 formed on the carrier wafer 110 can include a material which protects the material of the carrier wafer 110 during further processing. An oxygen-tight material is a specific example for the bonding layer 118. In further embodiments described below, the bonding layer 118 also forms a protection layer which can completely encapsulate the carrier wafer 110.

The bonding layer 108 can be an electrically conductive layer. This is beneficial if the carrier wafer 110 is later used as a backside contact for electrically contacting the silicon carbide layer 106. Furthermore, even when the carrier wafer 110 is finally removed, the electrically conductive bonding layer 108 can facilitate formation of a backside metallisation on the silicon carbide layer 106.

For forming the bonding layer 108, a carbide- and/or a silicide-forming metal can be deposited on the first side 101 of the silicon carbide wafer 100, which is subsequently subjected to a thermal treatment to allow reaction of the metal with the silicon carbide of the silicon carbide wafer 100. The deposition thickness for the metal can be comparably small as the main function of the metal is of the formation of a metal silicide or a metal carbide which both facilitate bonding to the carrier wafer 110.

The amount of the deposited metal can be adjusted such that most or all of the deposited metal reacts with the silicon carbide so that substantially no pure metal remains after the thermal treatment.

According to an embodiment, the carbide- and silicide-forming metal is a transition metal from one of groups 4 to 10 of the periodic table having this property. For example, the carbide and silicide forming metal may include, or be, at least one element selected from the group consisting of Mo, Ta, Nb, V, Ti, W, Ni, Al, Cu, V and Cr. Especially Ti, Mo and W are beneficial due to their high temperature strength. Further suitable materials are metal-silicon bilayers or other metal compounds capable of forming carbide and silicide.

The bonding layer 108 can include a plurality of different intermediate layers. In particular, the bonding layer 108 can contain reaction products of the carbide- and silicide-forming metal with the silicon carbide wafer 100, e.g. at least one carbide phase and/or at least one silicide phase. For example, in the case of the carbide- and silicide-forming metal being Mo, the phases may include one or more of MoCSi, MoSi, and MoC phases. Generally, these phases can be obtained by only moderately heating the silicon carbide wafer 100 (to less than 700° C. e.g. in the range 500-700° C.), and the resulting carbide phase and/or silicide phase are nevertheless generally highly temperature resistant and well-suited to the further processing steps and working conditions even at high temperature.

According to an embodiment, the bonding layer 108 is electrically conductive, and in particular has a resistivity of less than $10^{-3}$ Ω·m.

Using an electrically conductive bonding layer 108 formed by a metal carbide and/or metal silicide is particularly beneficial for using a graphite carrier wafer as such bonding layers provide a reliable and electrically conductive connection between the silicon carbide wafer 100 and the carrier wafer 110.

The formation of a bonding layer using a carbide and silicide-forming metal is described in more detail in US 2014/0225125 A1 which is hereby incorporated by reference.

According to a further embodiment, the bonding layer 108 can be an electrically insulating layer, for example a silicon oxide layer which also facilitates bonding to the carrier wafer 100.

According to a further embodiment, the bonding layer 108 is an adhesive bonding layer. The adhesive bonding layer can be formed by using a ceramic-forming polymer such as a SiC-ceramic forming polymer precursor, for example an organic adhesion precursors. The SiC-ceramic bonding layer 108 can be polycrystalline. A specific example of a SiC-ceramic forming polymer precursor is a carbosilane such as allyl-hydrido-polycarbosilane, which is particularly useful for bonding silicon carbide to graphite. This SiC-ceramic forming polymer precursor allows adhesive bonding and, in addition, is converted during bonding by pyrolization at high temperature to polycrystalline silicon carbide. The bonding layer 108 thus becomes a SiC layer which minimizes mechanical stress due to CTE mismatch and ensures a low-ohmic connection between the silicon carbide layer 106 and the graphite material of the carrier wafer 110.

The formation of an adhesive bond by using, for example, a bonding layer formed from a SiC-ceramic forming polymer precursor is explained in more detail in US 2015/0171045 A1 and DE 10 2014 118 336 A1 which are hereby incorporated by reference.

In a further process, as shown in FIG. 2C the silicon wafer 110 is bonded with its first side 101, or with the optional bonding layer 108 formed at the first side 101 of the silicon carbide wafer 100, to the first side 111, or to the optional bonding layer 118, of the carrier wafer 110. The bonding typically includes a thermal treatment at a temperature that is lower than the temperature needed for the subsequent delamination of the silicon carbide layer 106 so that the bonding does not affect the integrity of the silicon carbide wafer 100.

Different processes can be used for bonding. Examples are adhesive bonding using an adhesive bonding layer 108 and/or an adhesive bonding layer 118, reactive bonding, or diffusion bonding. Reactive bonding can also include formation of a thin metal layer on either or on each of the first side 101 of the silicon carbide wafer 100 and the first side 111 of the carrier wafer 110, respectively. During thermal treatment, the deposited metal reacts with the silicon carbide and the material, such as graphite, of the carrier wafer 110.

The thermal treatment for bonding the carrier wafer 110 to the silicon carbide wafer 100 can also be referred to as first thermal anneal which is carried out at a first temperature, or within a first temperature range.

In a subsequent process, as illustrated in FIG. 2D, a further thermal treatment at a higher temperature is carried out for delaminating the silicon carbide layer 106 from the silicon carbide wafer 100. The delamination occurs along the previously formed delamination region 105. The further thermal treatment can also be referred to as a second thermal anneal which is carried out at the second temperature, or within a second temperature range, which is higher than the first temperature and the first temperature range, respectively. According to an embodiment, the temperature for the delamination or splitting can be between 600° C. and 1200° C.

As a consequence of the further thermal treatment, or the second thermal anneal, the silicon carbide wafer 100 is split along the delamination region 105 so that the silicon carbide wafer 100 is separated into a residual silicon carbide wafer 100a and a thin silicon carbide layer 106 which remains bonded to the first side and/or the bonding layer or bonding layers 108/118.

The residual silicon carbide wafer 100a has a newly formed first side 101a that will be subsequently subjected to a polishing process for providing a smooth surface suitable to be bonded to another carrier wafer 100.

The silicon carbide layer 106 has an exposed side 106a, or a cleavage surface, defined by the previously formed delamination region 105. Therefore, the thickness d of the silicon carbide layer 106 approximately corresponds to the depth d where the delamination region 105 was formed.

The exposed side 106a of the silicon carbide layer 106 is typically also polished for obtaining a smooth surface for further processing such as formation of an epitaxial layer.

The delamination process as described herein is attractive for power devices on the basis of SiC. Examples are diodes, J-FETs, IGBTs, MOSFETs, SiC—SOI devices etc. The process starts with providing a silicon carbide wafer 100 and formation of an optional bonding layer which can be insulating or electrically conducting. After delamination, the silicon carbide wafer 100 can be reused several times, wherein each time the wafer has been used its thickness is reduced by the amount corresponding to the thickness of silicon carbide layer 106 which remains attached to the respective carrier wafer 110.

The formation of the delamination 105 and the delamination process is explained in more detail in US 2014/0335676 A1 and DE 10 2011 054 035 A1 which are hereby incorporated by reference.

The process can be continued by forming trenches 107 in the silicon carbide layer 106 as illustrated in FIGS. 2E and 2F. A mask layer 121 can be deposited onto the exposed side 106a of the silicon carbide layer 106, which mask layer 121 includes openings 122 where the trenches 107 are to be formed. Using an anisotropic etching process the trenches 107 are formed in the silicon carbide layer 106 to extend either fully through the silicon carbide layer 106 or to a given depth only which can be adjusted by selecting the etching time appropriately, for example. The mask layer 121 is subsequently removed.

The trenches 107 are typically formed when vertical power devices such as FETs and IGBTs of the trench structure type are manufactured. Other vertical power devices may not need trenches such as diodes. The formation of the trenches 107 is therefore optional.

In a further process, as illustrated in FIG. 2G, a graphene material 130 is formed on exposed regions of the silicon carbide layer 106 including the trenches 107. The trenches 107 include a bottom and sidewalls. The bottom of the respective trenches 107 may be formed by the material of the bonding layer 108/118, or by the carrier wafer 110 if no bonding layer were previously formed, when the trenches 107 were etched to completely extend through the silicon carbide layer 106. If the etching of the trenches 107 has been conducted such that the etching stops at a given distance from the first side 106a of the silicon carbide layer 106, the bottom of the respective trenches 107 is formed by material of the silicon carbide layer 106.

For forming the graphene material 130, a high-temperature process is applied to decompose the silicon carbide at the exposed surfaces of the silicon carbide layer 106, i.e. at the exposed side 106a and at least at the sidewalls of the trenches 107. This high-temperature process can be referred to as a third thermal anneal.

The high-temperature process can include two steps which have different functions. The first step, which is a high-temperature step, surficially decomposes silicon carbide by evaporating silicon leaving one or more single graphene layers at the surface of the silicon carbide layer 106. A typical temperature range for the first step can be between 1100° C. to 1600° C. typically between 1150° C. and 1600° C. and more typically between 1200° C. and 1600° C. The second step is for decoupling the previously formed one or more single graphene layers from the silicon carbide layer 106. Decoupling means that remaining covalent bonds and dangling bonds between the formed graphene layers and the silicon carbide material are eliminated.

According to an embodiment, the high-temperature step can be carried out at a temperature between 1200° C. and 1400° C. under vacuum. According to another embodiment, which forms another option for the high-temperature step, a thermal treatment is carried out in an inert atmosphere such as argon at a temperature between 1400° C. and 1650° C. The thermal treatment under argon atmosphere is beneficial as it does not require a low vacuum and yields higher quality graphene due to the higher forming temperature.

The first high-temperature step leads, depending on the duration and temperature, to the formation of at least one graphene layer on the silicon carbide layer 106. To be more specific, typically a so-called zero-layer graphene layer is formed which may not completely show all of the physical properties of graphene but which forms an interfacial layer between the silicon carbide of the silicon carbide layer 106 and the further graphene layer.

Typically at least one graphene layer, more typically at least two graphene layers are formed. Two graphene layers on top of each other show a band gap when an electrical field vertical to the graphene layers is supplied (the electrical field lines are vertical to the graphene layers). The thus created band gap can prevent a current flow along the graphene layers. This band gap disappears when the electrical field is switched-off so that a graphene layer, or graphene layers, can be used for forming a controllable channel region below a gate dielectric. The semiconductor devices with the at least one graphene layer incorporated into the channel region are normally-on devices as the channel is only blocked when a voltage is applied to the gate electrode to generate an electrical field. The created band-gap can be, for example, up to 200 meV.

According to an embodiment, the graphene material 130 formed on the silicon carbide layer 106 includes at least one, typically at least two graphene layers, and in particularly up to ten graphene layers. When referring to a graphene layer, a single graphene layer is meant. Hence, the graphene material 130 may include at least two single graphene layers. Graphene material that includes at least two single graphene layers can be beneficially used as conductive channels having a conductivity which can be easily controlled by applying a gate voltage to gate electrode arranged next to the graphene material.

The number of the graphene layers formed on the silicon carbide layer 106 can be influenced, in addition to the temperature and the duration of the anneal, also by the nature of the crystal plane of the silicon carbide layer 106. Typically, silicon carbide has so-called basal planes with two different surface terminations which can be the Si-terminated side and the C-terminated side. Single-layered graphene can be particularly formed at the Si-terminated side while multi-layered graphene can be more easily formed at the C-terminated side. If a single graphene layer is desired on the C-terminated side of the silicon carbide layer 106, a gentle etch-back step, for example in oxygen, can be applied to remove individual graphene layers.

According to an embodiment, the exposed side 106a of the silicon carbide layer 106 is the C-terminated side, and the graphene material 130 includes at least two graphene layers. The orientation of the silicon carbide layer 106 determines which of the Si-terminated side and the C-terminated side is the exposed side 106a. The orientation can be selected prior to bonding.

The second step for removing dangling bonds between the silicon carbide and the graphene layers can be carried out in an hydrogen-containing atmosphere at a temperature between 100° C. to 500° C., typically at a temperature around 300° C. It would, however, also be possible to subject the silicon carbide layer 106 after the first high-temperature step to a second step at a temperature higher than 500° C.

An alternative to the second step in hydrogen atmosphere is an implantation of silicon which can also remove the dangling bonds between the silicon carbide and the previously formed graphene material 130.

A possible process for forming the graphene material 130 can include a first step in argon atmosphere and a second step in hydrogen atmosphere as described above.

FIG. 2G illustrates that the graphene material 130 which includes at least one, typically at least two graphene layers, are formed on all exposed surface regions of the silicon carbide layer 106. If the formation in certain surface regions is not desired, a high-temperature durable mask may be formed to prevent formation of graphene in the regions covered by the mask. However, since the number of available materials which can withstand the temperature of the graphitization is limited, it is more beneficial to form first the graphene material 130 on the whole surface of the silicon carbide layer 106 including in the trenches 107 and then remove the graphene material 130 from the respective regions were no graphene material 130 is desired.

This is exemplified in FIG. 2H which illustrates the formation of respective masks 125 followed by an etching process to remove the graphene material 130 from the exposed side 106a of the silicon carbide layer 106. Typically, the graphene material 130 is left only in intended regions as it otherwise may interfere with device properties of the final semiconductor device.

The carrier wafer 110 including the bonding layer 108/118 can be finally removed, typically after completion of the respective semiconductor devices as shown in FIG. 2I. The removal of the carrier wafer 110 leads to an exposition of the previous first side 101 of the silicon carbide wafer 100, which first side is also referred to as the second side 106b of the silicon carbide layer 106.

When the carrier wafer 110 includes carbon or graphite, the carrier wafer 110 can be easily removed in an oxidising atmosphere. Complete removal of the carrier wafer is, however, not needed. According to an embodiment, the carrier wafer 110 is only partially removed by reducing its thickness.

If desired, respective metallisation and passivation layers can be formed on the second side 106b and the exposed side 106a, which is also referred to as the first side 106a of the silicon carbide layer 106. Formation of a separate metallisation layer on the second side 106b may not be needed if the carrier wafer 110 remains attached and is electrically conductive. It is, however, also possible to form a metallisation layer either on the carrier wafer 110 or on a partially removed carrier wafer 110.

With reference to FIGS. 3A and 3B modifications of the above described processes are explained.

According to an embodiment, the carrier wafer 110 includes a graphite core 103 and a protection layer 118 which typically completely encapsulates and thus protects the graphite core 103. The graphite core 103 can be formed from turbostratic or amorphous or user statically pressed crystalline graphite. Such graphite has a sufficiently height mechanical stability to support the silicon carbide layer 106 during processing. Graphite has furthermore a similar CTE to SiC, a good thermal conductivity, and a high electrical conductivity.

The graphite core 103 can be formed by moulding a composition including at least one of carbon powder and pitch followed thermal treatments to convert the moulding composition into graphite. The thermal treatments can include a debinding step at a temperature from about room temperature to about 600° C. to remove additives such as binders from the moulding composition followed by a thermal treatment from about 500° C. to about 1000° C. or even higher to convert the moulding composition into a graphite material.

The formation of a carrier wafer 110 which includes a graphite core 103 is explained in more detail in the above-mentioned US 2014/0335676 A1 and DE10 2011 054 035 A1 which are hereby incorporated by reference.

However, graphite is susceptible to oxidation and should be protected appropriately. For this purpose, the protection layer 118 is provided. An example for a suitable material for the protection layer 118 is polycrystalline silicon carbide which can be formed by various processes on the surface of the graphite core 103.

A first option, according to an embodiment, is the deposition of silicon on the core 103 of the carrier wafer 110 and then subjecting the deposited silicon to a heat treatment which causes reaction of the deposited silicon with the graphite of the core 103 to form the polycrystalline SiC layer. The heat treatment is typically carried out at a temperature above 1200° C., for example between 1500° C. and 1600° C.

A second option, according to an embodiment, is the deposition of silicon carbide on the core 103, for example by chemical vapour deposition. A polycarbosilane can be used as precursor for forming the protection layer 118 made of silicon carbide.

The use of silicon carbide as material for the protection layer 118 facilitates bonding between the carrier wafer 110 and the silicon carbide wafer 100 so that an additional bonding layer 108 may not be needed.

Alternatively, the protection layer can be a silicon nitride ($Si_3N_4$) layer or a silicon dioxide ($SiO_2$) layer.

Although graphite is susceptible to oxidation, a protection layer may not be needed if no oxidative processes are included in the processing of the semiconductor devices. The passivation layer 118 is therefore optional.

FIG. 3A also illustrates a further variation with regard to the silicon carbide layer 106. As mentioned above, an epitaxial silicon carbide layer 109 can be formed on the exposed side 106a of the silicon carbide layer 106. The thickness of the epitaxial layer 109 can be significantly larger than the thickness of the silicon carbide layer 106 which mainly acts as seed layer for the epitaxial layer 109.

The epitaxial process can be carried out under high temperatures up to about 1500° C. The epitaxial layer 109 can have a thickness from about 0.1 μm to about 1000 μm, particularly from about 0.1 μm to about 500 μm, more particularly from about 0.1 μm to about 300 μm. Further specific ranges are from about 0.1 μm to about 100 μm or in a range from about 1 μm to about 20 μm. The epitaxial layer 109 can be in-situ doped during deposition. Typically, the epitaxial layer 109 is n-doped with a doping concentration from about $10^{13}$ doping atoms per $cm^3$ to about $10^{18}$ doping atoms per $cm^3$. Alternatively, the epitaxial layer 109 can also be p-doped if desired or can be in-situ doped during epitaxial deposition to have a doping profile of varying doping concentration.

The silicon carbide layer 106 is typically of the same conductivity type as the epitaxial layer 109 when unipolar devices such as field effect transistors are formed. In case of bipolar devices such as IGBTs, the silicon carbide layer 106 can be of a conductivity type opposite to the conductivity type of the epitaxial layer 109.

FIG. 3A further illustrates that the trenches 107 are only formed in the epitaxial layer 109 and do not fully extend through the layer stack formed by the silicon carbide layer 106 and the epitaxial layer 109. The graphene material 130 is therefore formed on the exposed surface 109a of the epitaxial layer 109 and on the sidewalls and bottoms of the respective trenches 107. The layer stack formed by the epitaxial silicon carbide layer 109 and the silicon carbide layer 106 can also be referred to as silicon carbide layer that is attached to the carrier wafer 110 according to embodiments described herein. The exposed surface 109a of the epitaxial layer 109 thus forms the upper or first surface of the combined silicon carbide material which is bonded to the carrier wafer 110.

FIG. 3B illustrates the layer stack formed by both silicon carbide layers 106 and 109 after optional removal of the carrier wafer 110.

With reference to FIGS. 4A and 4B further variations of the above described processes are explained.

FIG. 4A illustrates the formation of graphene material 131 on the first side 101 of the silicon carbide wafer 100 prior to bonding according to an embodiment. The carrier wafer 110 can then be bonded either directly to the graphene material 131 or through an optional bonding layer 118 which may also form the protection layer 118 described above. The graphene material 131 can also form a bonding layer 118.

FIG. 4B illustrates the bonding using a bonding layer 118. However, the bonding layer 118 can also be omitted so that the graphene material 131 attached to the first side 101 of the silicon carbide wafer 100 comes in direct contact with the material of the carrier wafer 110. If graphite is used as the main material for the carrier wafer 110, a protection layer is typically formed as described above.

The graphene material 131 can remain on the silicon carbide layer 106 even after optional removal of the carrier wafer 110, and can be used as a highly conductive backside electrode on the second side of the silicon carbide layer 106. In addition to that, the graphene material 131 can also form a barrier against metal spiking or silicidation if an additional metallisation is formed on the graphene material 131. An additional metallisation can include aluminium and or copper, for example.

The graphene material 131 formed on the first side 101 of the silicon carbide wafer 100 can also be referred to as the first graphene material, while the graphene material 130 formed on the exposed side 106a of the delaminated silicon carbide layer 106, or the first side 109a of the epitaxial layer 109, can be referred to as a second graphene material.

The processes shown in FIGS. 2C to 2I can follow the processes illustrated in FIG. 4B so that graphene can also be formed on the exposed side 106a of the silicon carbide layer 106. The silicon carbide layer 106 can therefore have respective graphene material 130, 131 on both of its sides. It is, of course, also possible to additionally include the processes shown in FIGS. 3A and 3B.

A further embodiment is described with reference to FIG. 5.

Helium or protons 137 can be implanted into the exposed side 106a of the silicon carbide layer 106, or into the exposed side 109a of the epitaxial silicon carbide layer 109 if such an epitaxial layer has been formed. The implantation dose can be in a range of $10^{11}$ cm$^{-2}$ to $10^{13}$ cm$^{-2}$. Implanted helium protons form acceptor-like defects which leads to a partial or complete compensation, or even overcompensation, of the n-type background doping of the silicon carbide material of the silicon carbide layer 106 and the silicon carbide epitaxial layer 109, respectively. The partial or complete compensation of the background doping results in an increase of the electrical resistance of those silicon carbide material portions which are affected by the helium or proton implantation. These affected material portions are therefore rendered low conductive or even electrically insulating so that an electrically insulating region can be formed at the interface between the graphene material 130 and the silicon carbide material of the respective layer 106 and 109, respectively.

By using the above approach, it is possible to form a defect free graphene layer, or graphene layers, on insulating material.

FIG. 6 illustrates a semiconductor device formed by processes according to an embodiment. More specifically, FIG. 6 shows the formation of a unipolar semiconductor device having trenches.

A silicon carbide layer 206 having a first side 206a and a second side 206b includes, from the first side 206a to the second side 206b, a highly n-doped source region 241, a p-doped body region 242, weakly n-doped drift region 243, and a highly n-doped drain region 245. The doping concentration of the drift region 243 can correspond to the background doping of the silicon carbide wafer from which the silicon carbide layer 206 has previously been delaminated.

As the second side 206b of the silicon carbide layer 206 corresponds to the previous first side of the silicon carbide wafer, the drain region 245 can be formed prior to bonding the silicon carbide wafer to the carrier wafer 210.

The body region 242 and the source region 241 are typically formed in this order after delamination and polishing of the exposed side of the silicon carbide layer 206, which exposed side now forms the first side 206a of the silicon carbide layer 206. It is possible to form the body region 242 and the source region 241 either prior to or after the etching of the trenches 207 and the formation of the graphene material 230 on the exposed first side 206a and the exposed sidewalls and bottoms of the respective trenches 207.

By forming the body region 242, at least one pn-junction is formed in the silicon carbide layer 206 between the body region 242 and the drift region 243. A further pn-junction is formed between the body region 242 and the source region 241.

FIG. 6 also illustrates formation of an insulating layer 251 on the graphene material 230 and the formation of an electrically conductive layer 252 on the insulating layer 251. The insulating layer 251 forms gate dielectrics and the electrically conductive layer 252 forms respective gate electrodes 252 each arranged at least partially within the respective trenches 207.

The graphene material 230 completely lines in this embodiment the sidewalls and the bottom of each of the respective trenches 207. It is, however, not needed that the graphene material 230 is formed on the bottom of the trenches 207 as the channel region is that region within the body region 242 which is arranged between the drift region 243 and the source region 241.

An insulation layer 253 completely covers the first side 206a of the silicon carbide layer 206 and also embeds the gate electrodes 252 and the graphene material 230. As shown in FIG. 6, the gate dielectric 251 also completely covers the graphene material 230. The graphene material 230 is therefore spaced to, and separated from, a first metallisation 261 formed on the insulation layer 253. Source contacts 263 extend from the first metallisation 261 to the source region 241 and up to the body region 242 to provide an ohmic electrical contact between the first metallisation 261 and each of the source region 241 and the body region 242.

The carrier wafer 210, which is shown in this embodiment to include a core 203 and a protection layer 218 on both of its sides including the second side 212 of the carrier wafer, is shown to be attached to the second side 206b of the silicon carbide layer 206. The carrier wafer 210 can be subsequently removed from the second side 206b of the silicon carbide layer 206 so that a second metallisation can be formed to provide an ohmic electrical contact to the drain region 245.

It is, however, also be possible to keep the carrier wafer 210 attached to the silicon carbide layer 206 if the carrier wafer 210 including its optional protection layers 218 are electrically conductive. The carrier wafer 210 can also be referred to as carrier substrate for the final device as the wafer is cut into separate chips each having the silicon carbide layer 206 and a carrier substrate 210.

Figure 7:
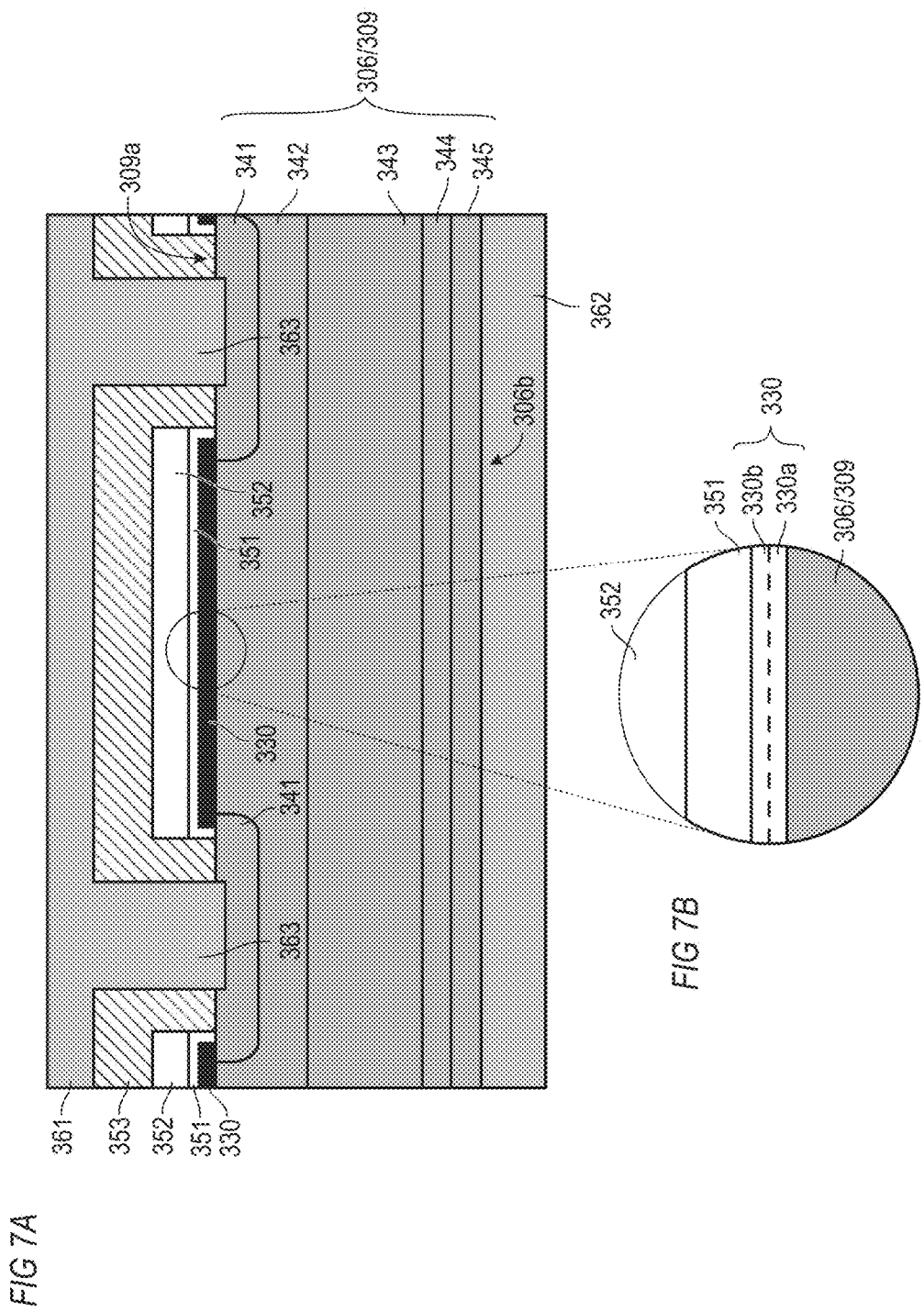
FIGS. 7A and 7B illustrate a semiconductor device according to an embodiment.

FIGS. 7A and 7B illustrate a further semiconductor device which is formed according to an embodiment described herein. More specifically, FIGS. 7A and 7B show a vertical bipolar semiconductor device, which can be an IGBT.

Different to the embodiment of FIG. 6, the semiconductor device of FIG. 7A includes a layer stack formed by the silicon carbide layer 306 and the epitaxial layer 309 formed on the silicon carbide layer 306. This layer stack has a first side 309a and a second side 306b formed opposite to the first side 306a. The layer stack includes from the first side 309a to the second side 306b, in this order, a highly and-doped source region 341, a p-doped body region 342, a weekly n-doped drift region 343, an n-doped field stop layer 344, and a highly p-doped emitter region 345.

The emitter region 345 may be formed by the silicon carbide layer 306 which was delaminated from a silicon carbide wafer as described above. When the silicon carbide wafer was n-doped, the silicon carbide layer 306 attached to a not shown carrier wafer is heavily doped to form a highly p-doped region. After this p-doping, the epitaxial layer 309 is formed, which can be in situ doped so that the field stop layer 344, which has a higher doping concentration than the drift region 343, is formed.

In another possible process, the highly p-doped emitter region 345 is formed by implantation after removal of the carrier wafer.

Different to the semiconductor device of FIG. 6, no trenches are formed at the first side 306a of the layer stack formed by the silicon carbide layer 306 and the silicon carbide epitaxial layer 309. The graphene material 330 is therefore only formed at the first side 306a directly above and in contact with the body region 342. The device of FIG. 7A can also include trenches as shown in FIG. 6.

The graphene material 330 is completely covered by the respective gate dielectric layers 351 on which the respective gate electrodes 352 are formed. Similar to the embodiment of FIG. 6, an insulation layer 353 is formed to completely cover the gate electrodes 352 and to provide electrical insulation between the gate electrode 352 and the first metallisation 361 formed on the insulation layer 353. The insulation layer 353 also spaces the graphene material 330 from source contacts 363 which provides an ohmic contact to the source regions 341.

A shown in FIG. 7B which illustrates an enlarged section, the graphene material 330 is formed by only two single graphene layers 330a and 330b. It is also possible that the graphene material 330 includes, or consists of, three single graphene layers, or four single graphene layers. The number of the graphene layers can be adapted according to specific needs.

A second metallisation 362 is shown to be formed at the second side 306b of the layer stack 306/309 after removal of the carrier wafer that was previously attached to this side. The second metallisation 362 provides an ohmic contact to the emitter region 345.

Figure 8:
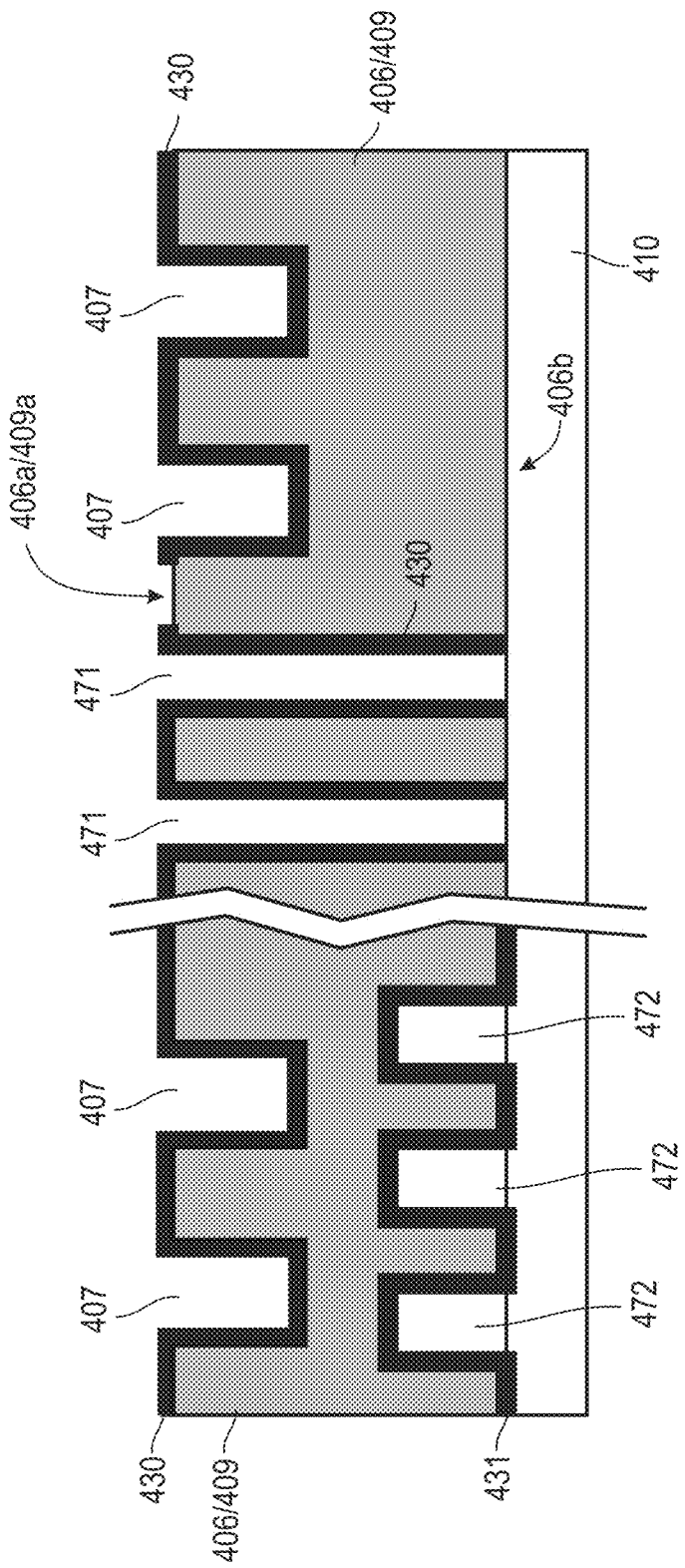
FIG. 8 illustrates processes of a method for manufacturing a semiconductor device according to an embodiment.

FIG. 8 shows further modification of processes for forming a semiconductor device according to an embodiment.

As illustrated in the left part of FIG. 8, trenches 407 are formed at the exposed or first side 406a/409a of the silicon carbide layer 406 or the silicon carbide epitaxial layer 409. The trenches 407 are lined with the graphene material 430, i.e. the graphene material 430 covers at least the sidewalls of the trenches 407. The trenches 407 at the first side 406a of the silicon carbide layer 406 or the silicon carbide epitaxial layer 409 can be referred to as first trenches. In addition to that, second trenches 472 are formed at the second side 406b of the silicon carbide layer 406 which second trenches 472 extend into the silicon carbide layer 406 or the silicon carbide epitaxial layer 409 without reaching the first side 406b/409b of the silicon carbide layer 406 or the silicon carbide epitaxial layer 409. The second trenches can be lined with the further graphene material 431 that has been formed on the second side 406b prior to bonding the silicon carbide wafer to the carrier wafer 410 (or carrier substrate). As the second trenches 472 are not completely filled, they form buried cavities.

The right part of FIG. 8 illustrates a further modification with second trenches 471 extending from the second side 406b completely through the silicon carbide layer 406 or the silicon carbide epitaxial layer 409 to the first side 406a/409a. The second trenches 471 can also be lined with the graphene material 430.

The modifications of FIG. 8 improves the robustness of the layer stack formed after bonding against formation of slip bands in the silicon carbide material.

It is to be understood that the features of the various exemplary embodiments described herein may be combined with each other, unless specifically noted otherwise.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for manufacturing a semiconductor device, the method comprising:
providing a carrier wafer and a silicon carbide wafer;
bonding a first side of the silicon carbide wafer to the carrier wafer;
splitting the silicon carbide wafer bonded to the carrier wafer into a silicon carbide layer thinner than the silicon carbide wafer and a residual silicon carbide wafer, the silicon carbide layer remaining bonded to the carrier wafer during the splitting; and
forming a graphene material on the silicon carbide layer.

2. The method of claim 1, further comprising:
forming trenches in the silicon carbide layer, the trenches having sidewalls; and
forming the graphene material at least on the sidewalls of the trenches.

3. The method of claim 1, further comprising:
implanting gas ions into the first side of the silicon carbide wafer prior to the bonding to form a delamination region at a predefined depth in the silicon carbide wafer; and
subjecting the silicon carbide wafer, after the bonding, to a thermal anneal to split the silicon carbide wafer along the delamination region, the splitting resulting in the formation of the silicon carbide layer having an exposed side.

4. The method of claim 3, further comprising:
forming an epitaxial SiC layer on the exposed side of the silicon carbide layer prior to forming the graphene material, so that the graphene material is formed on the epitaxial SiC layer.

5. The method of claim 1, wherein the carrier wafer comprises a core comprising at least one of graphite, carbon, sapphire, silicon, and a combination thereof.

6. The method of claim 5, further comprising:
forming a passivation layer on the carrier wafer to encapsulate the core of the carrier wafer.

7. The method of claim 6, wherein the passivation layer comprises polycrystalline SiC and the core comprises graphite, the method further comprising:
forming the passivation layer by at least one of:
depositing Si on the core of the carrier wafer and subjecting the deposited Si to a heat treatment to cause reaction of the deposited Si with the core of the carrier wafer; and
depositing SiC on the core.

8. The method of claim 1, wherein the graphene material comprises between 2 and 10 single graphene layers.

9. The method of claim 1, wherein the silicon carbide layer is n-doped, the method further comprising:
implanting at least one of helium and protons into the silicon carbide layer after forming the graphene material.

10. The method of claim 9, wherein the at least one of helium ions and protons are implanted with an implantation dose of $10^{11}$ cm$^{-2}$ to $10^{13}$ cm$^{-2}$.

11. The method of claim 1, further comprising:
forming a further graphene material on the first side of the silicon carbide wafer prior to the bonding.

12. The method of claim 1, wherein forming the graphene material comprises:
subjecting the silicon carbide layer to a thermal anneal between about 1100° C. and 1600° C.

13. The method of claim 1, further comprising:
forming at least one pn-junction in the silicon carbide layer.

14. The method of claim 1, further comprising:
forming a first metallization on the silicon carbide layer after forming the graphene material.

15. The method of claim 14, further comprising:
forming a second metallization on a side of the silicon carbide layer opposite a side of the silicon carbide layer on which the first metallization is formed.

16. The method of claim 1, further comprising:
at least partially removing the carrier wafer from the silicon carbide layer after forming the graphene material.

17. The method of claim 1, further comprising:
forming an insulating layer on the graphene material; and
forming an electrically conductive layer on the insulating layer.

18. A method for manufacturing a semiconductor device, the method comprising:
providing a carrier wafer and a silicon carbide wafer;
implanting gas ions into a first side of the silicon carbide wafer to form a delamination region at a predefined depth in the silicon carbide wafer;
bonding the first side of the silicon carbide wafer to the carrier wafer;
subjecting the silicon carbide wafer, after the bonding, to a thermal anneal to split the silicon carbide wafer along the delamination region, the splitting resulting in the formation of a silicon carbide layer remaining bonded to the carrier wafer and a residual silicon carbide wafer, the silicon carbide layer having an exposed side;
forming a trench in the silicon carbide layer, the trench comprising sidewalls; and
forming a graphene material on at least one of the sidewalls of the trench and the exposed side of the silicon carbide layer.

19. The method of claim 18, further comprising:
forming a bonding layer on at least one of the first side of the silicon carbide wafer and a first side of the carrier wafer, the bonding layer comprising a material selected from the group consisting of a metal, metal carbide, metal silicide, carbon powder, pitch, graphite, alumina glass, silica glass, and a mixture of alumina and silica glass.

20. The method of claim 19, wherein the metal comprises a metal capable of forming at least one of metal carbide and metal silicide.

21. The method of claim 18, further comprising:
providing a ceramic-forming polymer precursor on at least one of the first side of the silicon carbide wafer and a first side of the carrier wafer to form an adhesive bonding layer.

* * * * *